United States Patent
Vadi (10) Patent No.: US 7,394,708 B1
(45) Date of Patent: Jul. 1, 2008

(54) ADJUSTABLE GLOBAL TAP VOLTAGE TO IMPROVE MEMORY CELL YIELD

(75) Inventor: Vasisht Mantra Vadi, San Jose, CA (US)

(73) Assignee: XILINX, Inc., San Jose, CA (US)

( * ) Notice: Subject to any disclaimer, the term of this patent is extended or adjusted under 35 U.S.C. 154(b) by 252 days.

(21) Appl. No.: 11/083,812

(22) Filed: Mar. 18, 2005

(51) Int. Cl.
*G11C 7/00* (2006.01)

(52) U.S. Cl. ............. 365/201; 365/185.07; 365/185.18; 365/185.22; 365/185.27

(58) Field of Classification Search ............ 365/185.07, 365/185.18, 185.22, 185.27, 201
See application file for complete search history.

(56) References Cited

U.S. PATENT DOCUMENTS

| | | | |
|---|---|---|---|
| 3,995,261 A | | 11/1976 | Goldberg |
| 4,020,469 A | | 4/1977 | Manning |
| 4,700,187 A | | 10/1987 | Furtek |
| 4,899,067 A | | 2/1990 | So et al. |
| 5,179,539 A | * | 1/1993 | Horiguchi et al. |
| 5,220,534 A | | 6/1993 | Loh et al. |
| 5,325,054 A | * | 6/1994 | Houston |
| 5,349,248 A | | 9/1994 | Parlour et al. |
| 5,404,359 A | | 4/1995 | Gellenwater et al. |
| 5,430,734 A | | 7/1995 | Gilson |
| 5,459,342 A | | 10/1995 | Nogami et al. |
| 5,485,102 A | | 1/1996 | Cliff et al. |
| 5,498,975 A | | 3/1996 | Cliff et al. |
| 5,498,979 A | | 3/1996 | Parlour et al. |
| 5,539,652 A | | 7/1996 | Tegethoff |
| 5,592,102 A | | 1/1997 | Lane et al. |
| 5,622,880 A | * | 4/1997 | Burr et al. ............... 438/194 |
| 5,726,944 A | * | 3/1998 | Pelley et al. ............. 365/226 |
| 5,777,887 A | | 7/1998 | Marple et al. |
| 5,790,771 A | | 8/1998 | Culbertson et al. |

(Continued)

FOREIGN PATENT DOCUMENTS

JP    402235300 A   *  9/1990

(Continued)

OTHER PUBLICATIONS

Gupta et al.; "Generation of PD Patterns and Computer Aided Analysis for Defects in GIS"; High Voltage Engineering, 1999, Eleventh International symposium on (Conf. Publ. No. 467), vol. 5; vol. t; 23-27 Aug. 1999; pp. 284-287.

(Continued)

*Primary Examiner*—Viet Q. Nguyen
(74) *Attorney, Agent, or Firm*—William L. Paradice, III (57) ABSTRACT

A system that increases device yield by correcting improper operation of the device's memory cells due to process variations is disclosed. The device includes an array of memory cells and an adjustable bias voltage circuit, and is coupled to a test circuit that generates a feedback signal indicating whether one or more of the memory cells fail to operate properly. The adjustable bias voltage circuit selectively adjusts a bias voltage tied to the substrate provided to the memory cells in response to the feedback signal to alter the operating characteristics of the memory cells so that all of the memory cells will operate properly. For some embodiments, a plurality of fuses are provided for storing control signals that control the bias voltage provided to the memory cells.

20 Claims, 10 Drawing Sheets

U.S. PATENT DOCUMENTS

| | | | |
|---|---|---|---|
| 5,818,792 A * | 10/1998 | Sasaki et al. ............ | 365/230.08 |
| 5,889,413 A | 3/1999 | Bauer | |
| 5,903,578 A | 5/1999 | De et al. | |
| 5,914,616 A | 6/1999 | Young et al. | |
| 5,982,683 A | 11/1999 | Watson et al. | |
| 5,985,727 A * | 11/1999 | Burr ............................ | 438/302 |
| 6,044,025 A | 3/2000 | Lawman | |
| 6,075,418 A | 6/2000 | Kingsley et al. | |
| 6,097,646 A * | 8/2000 | Fournel ....................... | 365/201 |
| 6,128,214 A | 10/2000 | Kuckes et al. | |
| 6,166,559 A | 12/2000 | McClintock et al. | |
| 6,167,558 A | 12/2000 | Trimberger | |
| 6,215,327 B1 | 4/2001 | Lyke | |
| 6,216,258 B1 | 4/2001 | Mohan et al. | |
| 6,232,845 B1 | 5/2001 | Kingsley et al. | |
| 6,237,131 B1 | 5/2001 | MacArthur et al. | |
| 6,256,767 B1 | 7/2001 | Kuckes et al. | |
| 6,262,625 B1 * | 7/2001 | Perner et al. .................... | 330/2 |
| 6,292,018 B1 | 9/2001 | Kean | |
| 6,314,019 B1 | 11/2001 | Kuckes et al. | |
| 6,331,788 B1 | 12/2001 | Lyke | |
| 6,333,879 B1 * | 12/2001 | Kato et al. | |
| 6,344,755 B1 | 2/2002 | Reddy et al. | |
| 6,353,915 B1 | 3/2002 | Deal et al. | |
| 6,356,514 B1 | 3/2002 | Wells et al. | |
| 6,424,142 B1 * | 7/2002 | Kato et al. | |
| 6,427,156 B1 | 7/2002 | Chapman et al. | |
| 6,432,740 B1 | 8/2002 | Chen | |
| 6,459,095 B1 | 10/2002 | Heath et al. | |
| 6,466,506 B2 * | 10/2002 | Shiomi | |
| 6,487,105 B2 * | 11/2002 | Morihara et al. | |
| 6,496,027 B1 * | 12/2002 | Sher et al. | |
| 6,526,559 B2 | 2/2003 | Sato et al. | |
| 6,532,579 B2 | 3/2003 | Sato et al. | |
| 6,539,508 B1 | 3/2003 | Patrie et al. | |
| 6,651,225 B1 | 11/2003 | Lin et al. | |
| 6,651,238 B1 | 11/2003 | Wells et al. | |
| 6,664,808 B2 | 12/2003 | Ling et al. | |
| 6,732,348 B1 | 5/2004 | Tahoori et al. | |
| 6,756,805 B2 * | 6/2004 | Sher et al. | |
| 6,807,109 B2 * | 10/2004 | Tomishima ............ | 365/189.05 |
| 6,809,576 B1 * | 10/2004 | Yamasaki | |
| 6,817,006 B1 | 11/2004 | Wells et al. | |
| 6,886,117 B2 | 4/2005 | Ku | |
| 6,891,395 B2 | 5/2005 | Wells et al. | |
| 6,900,656 B1 * | 5/2005 | Houston et al. .............. | 324/765 |
| 6,911,703 B2 * | 6/2005 | Hidaka ........................ | 257/369 |
| 6,954,396 B2 * | 10/2005 | Yamaoka et al. | |
| 7,007,250 B1 | 2/2006 | Bapat et al. | |
| 7,009,900 B2 * | 3/2006 | Goldbach et al. | |
| 7,023,740 B1 * | 4/2006 | Wong et al. | |
| 7,047,465 B1 | 5/2006 | Trimberger | |
| 7,058,534 B1 | 6/2006 | Tracy et al. | |
| 7,058,918 B2 | 6/2006 | Abramovici et al. | |
| 7,062,692 B1 * | 6/2006 | Lesea .......................... | 714/725 |
| 7,111,213 B1 | 9/2006 | Dastidar et al. | |
| 7,120,050 B2 * | 10/2006 | Kawabata et al. ....... | 365/185.01 |
| 7,127,697 B1 | 10/2006 | Wells et al. | |
| 7,129,745 B2 * | 10/2006 | Lewis et al. .................... | 326/38 |
| 7,139,955 B2 | 11/2006 | Rohrbaugh et al. | |
| 7,143,295 B1 | 11/2006 | Trimberger | |
| 7,219,314 B1 | 5/2007 | Trimberger et al. | |
| 2004/0153928 A1 | 8/2004 | Rohrbaugh et al. | |
| 2004/0187060 A1 | 9/2004 | Rohrbaugh et al. | |
| 2004/0216081 A1 | 10/2004 | Wells et al. | |

FOREIGN PATENT DOCUMENTS

| | | | |
|---|---|---|---|
| JP | 405002883 A * | 1/1993 | |
| WO | WO 03/014750 | 2/2003 | |

OTHER PUBLICATIONS

Guler et al.; "Built-in Self-Test Generator Design Using Nonuniform Cellular Automata Model"; IEEE Proceedings Circuits Device and System; Jun. 1998; vol. 145; No. 3, pp. 155-161.

Champeau et al.; "Flexible Parallel FPGA-Based Architecture with ArMen"; 1994 IEEE Proceedings of Twenty-Seventh Annual Hawaii International Conference on System Sciences; 1994; pp. 105-113.

Smith, Michael John Sebastian; "Application-Specific Integrated Circuits", Assison-Wesley VLSI Systems Series, Chapter 14; pp. 711-804, 1997.

Xilinx, Inc.; DS031-2; "Virtex-II 1.5V Field Programmable Gate Arrays"; Advanced Product Specification; Nov. 29, 2001, pp. 1-39, DS031-2 (v1.9), Xilinx, Inc. 2100 Logic Drive, San Jose, CA 95124.

John Emmert et al.; "Dynamic Fault Tolerance in FPGAs via Partial Reconfiguration"; Annual IEEE Symposium on Field-Programmable Custom Computing Machines; Apr. 17, 2000; pp. 165-174.

John M. Emmert et al.; "Incremental Routing in FPGAs"; ASIC Conference 1998. Proceedings, Eleventh Annual IEEE International; Rochester, NY; Sep. 13-16, 1998; pp. 217-221.

Sharp, Steve; "Xilinx Delivers Lower Cost While Continuing to Redefine Programmable Logic," 2002, pp. 6-8, available from Xilinx, Inc., 2100 Logic Drive, San Jose, CA 95124.

Tahoori, Mehdi, B. et al; "Improving Detectability of Resistive Open Defects in FPGA," Center for Reliable Computing, available from Stanford University, Stanford CA 94305.

Overton, Rick; "Molecular Electronics Will Change Everything,"Wired.com, Issue 8.07, Jul. 2000, pp. 1-12, available from www.wired.com/wired/archive/8.07/moletronics_pr.html.

Brown, Chappell; "Researchers Close To Delivering Molecular Circuits," Tektronix, Feb. 12, 2002, pp. 1-4, Available from EETimes @ http://www.eetimes.com/story/OEG20020215S0063.

Nackashi, David P. et al.; "Molectronics: A Circuit Design Perspective," pp. 1-9, Dept. of Electrical and Computer Engineering, North Carolina State University, ECE, Box 7914, NCSU, Raleigh, NC 27695-7914, available from http://www.ece.ncsu.edu/erl/faculty/paulf.html.

Goldstein, Seth Copen et al.; "NanoFabrics: Spatial Computing Using Molecular Electronics," The 28th Annual International Symposium on Computer Architecture, Jun. 2001, pp. 1-12, available from Carnegie Mellon University, School of Computer Science, Pittsburgh PA 15213-3891.

Tahoori, Mehdi B. et al.; "Automatic Configuration Generation for FPGA Interconnect Testing," pp. 2-6, availabel from Center for Relaiable Computing, Stanford University, Stanford, CA.

Howard et al., "The Yield Enhancement of Field-Programmable Gate Arrays", IEEE Transactions on Very Large Scale Integration (VLSI) Systems, vol. 2, No. 1, Mar. 1994, pp. 115-123.

Kelly et al., "Defect Tolerant SRAM Based FPGA's", IEEE International Conference on Computer Design, VLSI in Computers and Processors, Oct. 10, 1994, pp. 479-482.

Mathur et al., "Timing Driven Placement Reconfiguration for Fault Tolerance and Yield Enhancement in FPGA's", Proceedings of European Design and Test Conference, Mar. 11, 1996, pp. 165-169.

Feng et al., "Reconfiguration of One-Time Programmable FPGAs with Faulty Logic Resources", International Symposium on Defect and Fault Tolerance in VLSI Systems, Nov. 1999, pp. 368-376.

Thoori, Mehdi B. et al., "Techniques and Algorithms for Fault Grading of FPGA Interconnect Test Configurations", IEEE Transactions on Computer-Aided Design of Integrated Circuits and Systems, vol. 23, No. 2, Feb. 2004, pp. 261-272.

Hanchek et al., "Methodologies for Tolerating Cell and Interconnect Faults in FPGAs", IEEE Transactions on Computers, vol. 47, No. 1, Jan. 1998, pp. 15-33.

U.S. Appl. No. 09/839,041, Nelson, Michael D., filed Apr. 19, 2001, entitled "Method for Storing and Shipping Programmable ASSP Devices", 31 pages, Xilinx, Inc., 2100 Logic Drive, San Jose, California.

* cited by examiner

ADJUSTABLE GLOBAL TAP VOLTAGE TO IMPROVE MEMORY CELL YIELD

FIELD OF INVENTION

The present invention relates generally to integrated circuit (IC) devices, and more specifically to improving the yield of IC devices that utilize memory cell arrays.

DESCRIPTION OF RELATED ART

A programmable logic device (PLD) is a general-purpose device that can be programmed by a customer to implement a variety of different user circuit designs. One type of PLD is the Field Programmable Gate Array (FPGA), which typically includes an array of individually configurable logic blocks (CLBs) selectively connected to a plurality of input/output blocks (IOBs) by a programmable interconnect structure. Additional resources such as multipliers, block memory, microprocessors, and the like may also be included. As known in the art, the CLBs, IOBS, and programmable interconnect structure may be programmed to implement a user design by loading configuration data into configuration memory cells that control the configurations of the CLBs, IOBs, and programmable interconnect structure. For example, the configuration data is typically provided to the FPGA from an external memory source and loaded into the configuration memory cells during a well-known configuration operation.

Because an FPGA may implement a variety of user designs, it is imperative that each and every resource of the FPGA is working properly when delivered to a customer. For example, if one or more of an FPGA's configuration memory cells fail to operate properly, the FPGA is typically discarded because failure of any of its configuration memory cells may prevent the FPGA from properly implementing one or more of the various user designs, which undesirably reduces device yield.

Although redundancy techniques exist for general-purpose memories (e.g., such as Flash memory chips) that replace a defective row or column of memory cells with a spare row or column of memory cells, the circuitry required to implement such redundancy techniques in an FPGA's configuration memory is typically prohibitive. For example, unlike memory chips implemented for general use, the configuration memory cells of an FPGA device are coupled to various resources of the FPGA by a complex signal routing architecture responsible for providing large numbers of configuration data bits to corresponding programmable elements distributed across the FPGA. As a result, the signal routing overhead required to implement redundancy techniques in an FPGA's configuration memory is typically unfeasible.

An alternate approach for increasing the yield of FPGA devices is to disable those FPGA resources that are controlled by improperly operating (e.g., defective) configuration memory cells. For example, U.S. Pat. No. 6,664,808, which is incorporated herein by reference, discloses a method for determining whether an FPGA that has one or more defective configuration memory cells may nevertheless be used to implement a specified user design. More specifically, as taught in U.S. Pat. No. 6,664,808, an FPGA having one or more defective configuration memory cells is tested to determine whether the FPGA can properly implement a specified user design, and if it can, the FPGA may be subsequently utilized by a customer to implement the specified user design. However, although increasing yield by salvaging some FPGA devices that would otherwise be discarded because of defective configuration memory cells, FPGAs salvaged by the methods disclosed in U.S. Pat. No. 6,664,808 may only implement those user designs that were specifically tested by such techniques, and therefore have a limited market.

Thus, it would be desirable to salvage PLDs such as FPGA devices that would otherwise be discarded because of one or more improperly operating configuration memory cells without utilizing costly redundancy techniques and without limiting the number of different user designs that may be implemented by the PLD.

SUMMARY

A method and apparatus are disclosed that may increase the yield of PLDs such as FPGAs that would otherwise be discarded because one or more of their configuration memory cells fail to operate properly due to process variations inherent in the fabrication of such devices. In accordance with the present invention, a PLD includes an adjustable bias voltage circuit that selectively biases the substrates of the device's configuration memory cells in response to a feedback signal indicating whether one or more of the configuration memory cells fail to operate properly. The adjustable bias circuit includes a control circuit and a configurable voltage-divider circuit. The control circuit has inputs to receive the feedback signal and has outputs to provide one or more bias control signals to corresponding control terminals of the configurable voltage-divider circuit. In response to the feedback signal, the control circuit selectively asserts the bias control signals, which in turn select which of a plurality of bias voltages the configurable voltage-divider circuit provides to the memory cells' transistors substrate nodes.

An external (e.g., off-chip) test circuit is utilized to test the device's memory cells, and in response thereto generates the feedback signal. For other embodiments, the test circuit may be implemented on-chip or within the PLD. The test circuit includes a test port to communicate with the device's memory cells, and includes an output port to provide the feedback signal to the device's adjustable bias voltage circuit. The test circuit, which generates input test data which is written into the device's configuration memory, compares data subsequently read from the configuration memory with the input test data to determine whether all of the configuration memory cells operate properly. If one or more of the configuration memory cells fail to operate properly, the test circuit asserts the feedback signal, which in turn causes the adjustable bias circuit to adjust a bias voltage provided to the configuration memory cells to alter their operating characteristics so that all of the memory cells will operate properly. The test circuit continues to test the configuration memory until all of its memory cells operate properly, and then de-asserts the feedback signal, which in turn causes the adjustable bias voltage circuit to maintain the desired bias voltage for the configuration memory cells.

For some embodiments, the control circuit includes a set of non-volatile memory elements such as a fuse bank that may be used to store values of the bias control signals that cause the configurable voltage-divider circuit to provide the desired bias voltage to the device's configuration memory so that all of its memory cells will operate properly. For example, a device manufacturer may program the fuse bank with suitable values of the bias control signals that appropriately compensate for process variations in the device's configuration memory that originally caused one or more of its memory cells to operate improperly. Once the fuse bank is programmed with the desired bias control signals, the device may be delivered to a customer as a fully-operational PLD.

Thereafter, upon subsequent power-up of the device by the customer, the adjustable bias voltage circuit provides the desired bias voltage to the configuration memory so that all of its memory cells operate properly. In this manner, embodiments of the present invention not only increase yield by "saving" devices that would otherwise be discarded for failure of its configuration memory cells due to process variations, but also operate transparently to the customer.

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

Exemplary embodiments of the present invention are described below in the context of biasing one or more n-well regions within which the PMOS transistors that form the configuration memory cells of a PLD are implemented. It is to be understood that embodiments of the present invention may also be used to bias the p-type region(s) or substrate within which the NMOS transistors that form the configuration memory cells of the PLD are implemented in a triple well process. Further, embodiments of the present invention are equally applicable to biasing the memory cells of other types of memory arrays, for example, such as the block RAM of PLDs and/or the general-purpose memories provided in non-configurable semiconductor devices such as ASIC devices. In the following description, for purposes of explanation, specific nomenclature is set forth to provide a thorough understanding of the present invention. In other instances, well-known circuits and devices are shown in block diagram form to avoid obscuring the present invention unnecessarily. Further, the logic levels assigned to various signals in the description below are arbitrary, and therefore may be modified (e.g., reversed polarity) as desired. Additionally, single signal lines may alternatively be multiple signal lines or buses, and multiple signal lines or buses may be single signal lines. Accordingly, the present invention is not to be construed as limited to specific examples described herein but rather includes within its scope all embodiments defined by the appended claims.

The operational failure of one or more configuration memory cells in a PLD such as an FPGA device may result from process variations inherent in the fabrication of semiconductor devices. Indeed, such process variations often cause devices of the same design to behave differently and/or cause similar circuit elements within the same device to behave differently. For example, devices of the same design cut from different portions of the same wafer, from different wafers, and/or fabricated by different foundries often exhibit different operating characteristics that may cause one or more of the memory cells of a number of the devices to operate improperly, which in turn may preclude some of the FPGA devices from implementing a desired variety of user designs.

Figure 1:
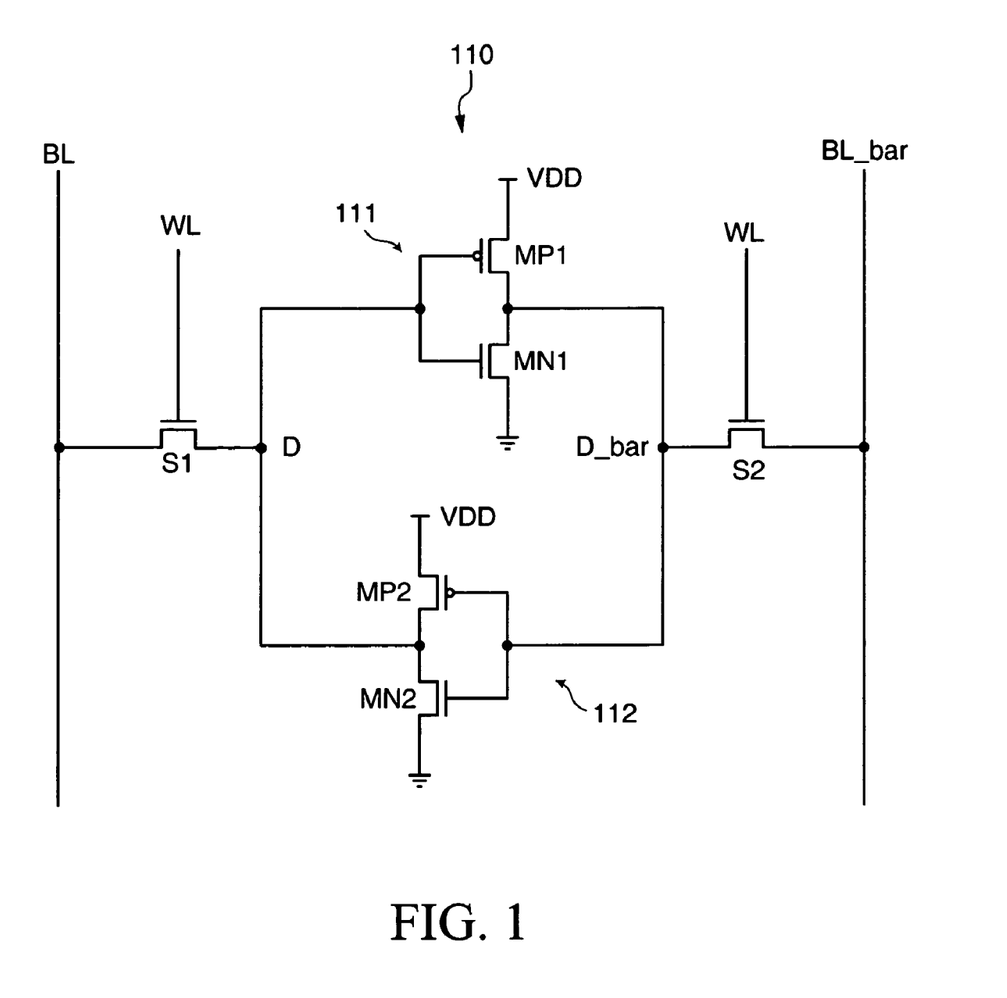
FIG. 1 is a circuit diagram of a prior art SRAM cell.

FIG. 1 shows a well-known SRAM cell 100 having a memory element 110 formed by cross-coupled CMOS inverters 111 and 112. Inverter 111 is formed by a PMOS transistor MP1 and an NMOS transistor MN1 coupled between a supply voltage VDD and ground potential, with the commonly coupled gates of MP1 and MN1 forming a data node D for memory element 110. Inverter 112 is formed by a PMOS transistor MP2 and an NMOS transistor MN2 coupled between VDD and ground potential, with the commonly coupled gates of MP2 and MN2 forming a complementary data node D_bar. A first NMOS select transistor S1 coupled between data node D and a bit line BL has a gate coupled to a word line WL. A second NMOS select transistor S2 coupled between data node D_bar and a complementary bit line BL_bar has a gate coupled to WL. Although not shown in FIG. 1 for simplicity, the bulk and source terminals of each of NMOS transistors MN1-MN2 and each of PMOS transistors MP1-MP2 are coupled together, and the bulk terminals of NMOS select transistors S1-S2 are coupled to ground potential. Operation of memory cell 100 is well-known, and therefore is not further described herein for simplicity.

Figure 2:
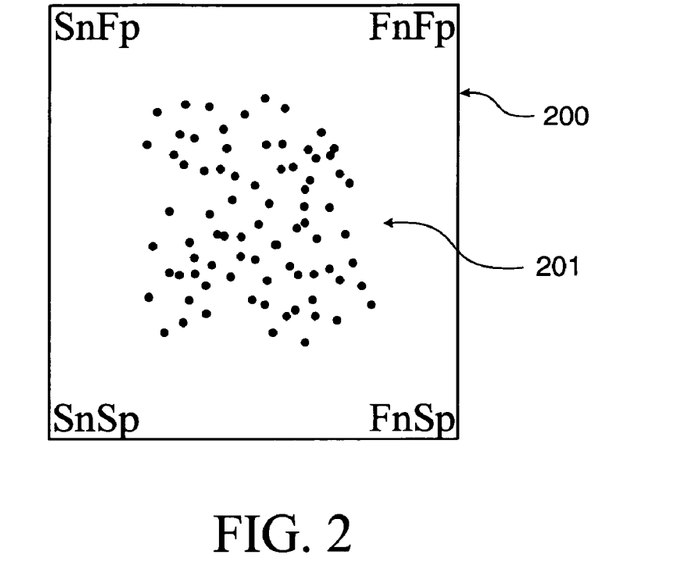
FIG. 2 illustrates an exemplary process distribution for a plurality of memory cell devices with respect to an acceptable range of process margin.

As mentioned above, process variations inherent in the fabrication of semiconductor devices often result in devices of the same design to behave differently. More specifically, these process variations may cause one or more of the transistors which form SRAM cell 100 to be either too slow (e.g., weaker than a nominal transistor) or too fast (e.g., stronger than a nominal transistor), which in turn may cause the memory cell to operate improperly. For example, FIG. 2 depicts an exemplary process distribution 201 of a plurality of memory cell devices of the same design with respect to an acceptable range of process margin depicted by plot 200. The process distribution 201 may be representative of process variations between devices formed from the same wafer and/or between devices formed from different wafers. Plot 200 is shown as having four process corners SnSp, SnFp, FnFp, and FnSp, where devices near the SnSp corner have NMOS and PMOS transistors that are too slow, devices near the SnFp corner have NMOS transistors that are too slow and have PMOS transistors that are too fast, devices in the FnFp corner have NMOS and PMOS transistors that are too fast, and devices in the FnSp corner have NMOS devices that are too fast and have PMOS devices that are too slow.

For the exemplary relationship illustrated in FIG. 2, all the devices represented by process distribution 201 fall within the acceptable range of process margin depicted by plot 200, and thus the memory cells 100 within all such devices are deemed to operate properly (e.g., assuming that the devices do not have gross defects such as stuck-at faults that would otherwise cause the devices to fail).

Figure 3A:
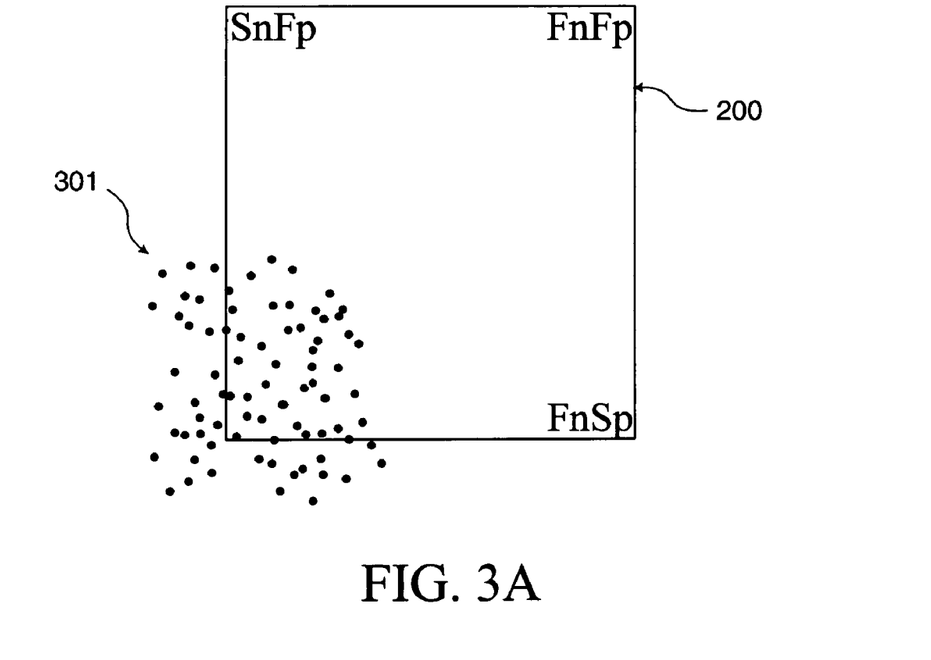
FIGS. 3A-3D illustrate various relationships between the exemplary device process distribution of FIG. 2 and the acceptable range of process margin.
Figure 3B:
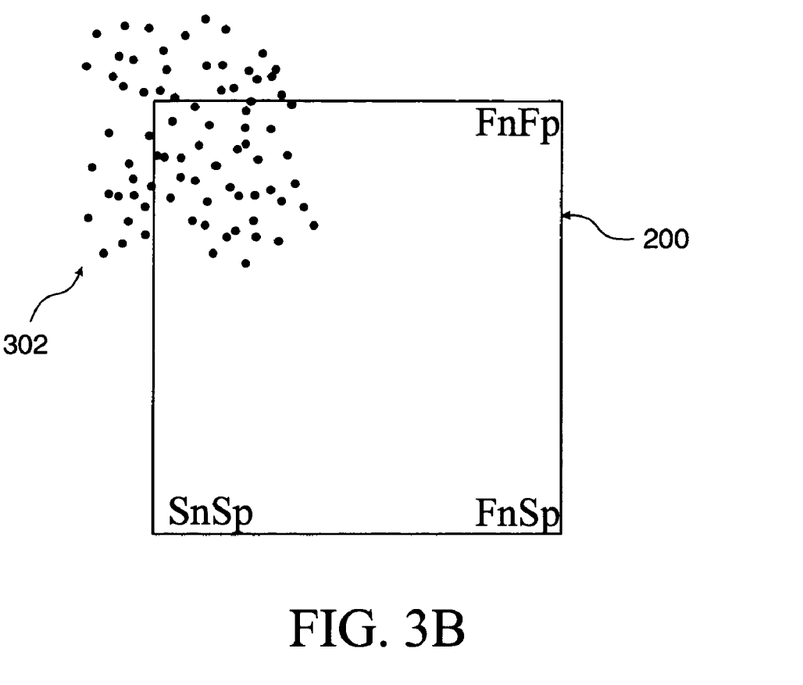
Figure 3C:
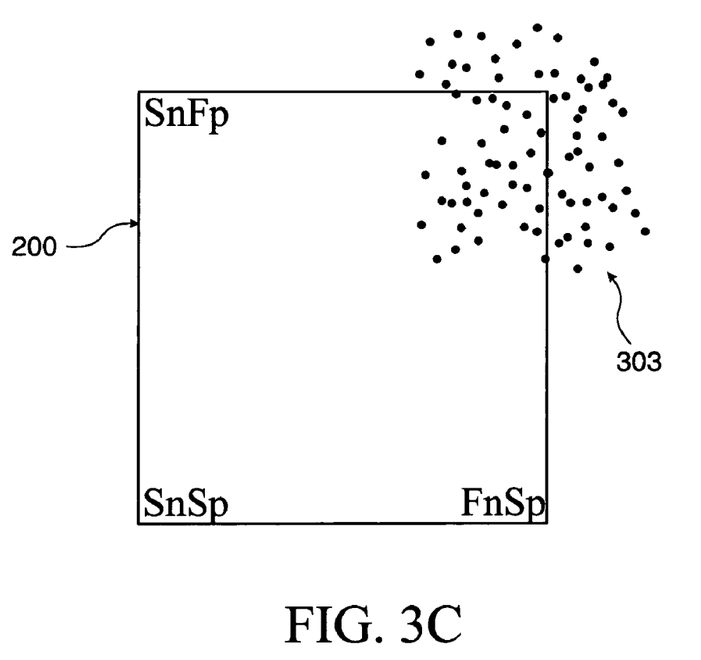
Figure 3D:
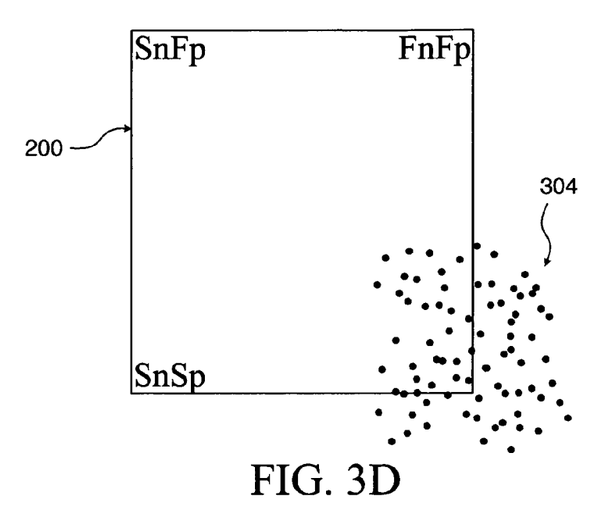

However, if both the NMOS and PMOS transistors of SRAM cell 100 are too slow, the corresponding memory element 110 may not be able to drive the precharged high dataline low for read operations. This problem, which is commonly referred to as "read failure," may cause memory cell 100 to output an incorrect data signal during read operations, even though the memory cell retains the correct data value. This condition is depicted in FIG. 3A, which shows an exemplary device process distribution 301 concentrated in the SnSp process corner and having many devices that fall outside the acceptable range of process margin 200. If the NMOS transistors are too slow and the PMOS transistors are too fast, write operations to memory cell 100 may fail, as known in the art. This condition is depicted in FIG. 3B, which shows an exemplary device process distribution 302 concentrated in the SnFp process corner and having many devices that fall outside plot 200. If the NMOS and PMOS transistors are too fast, memory cell 100 may exhibit an un-acceptable amount of leakage current, as known in the art. This may cause the precharged dataline to leak away before the read operation and may also cause a read failure. This condition is depicted in FIG. 3C, which shows an exemplary device process distribution 303 concentrated in the FnFp process corner and having many devices that fall outside plot 200. Lastly, if the NMOS transistors are too fast and the PMOS transistors are too slow, there may be an undesirable voltage spike in the data node(s) of memory cell 100 during read operations. This condition is depicted in FIG. 3D, which shows an exemplary device process distribution 304 concentrated in the FnSp process corner and having many devices that fall outside plot 200. In addition, asymmetry between complementary portions of memory cell 100 may result in read disturb, which is a well-known phenomena that may inadvertently flip the logic state stored in memory cell 100 during read operations, which in turn may result in device failure.

The speed (e.g., and thus the relative strength) of an NMOS transistor may be increased by more positively biasing its bulk terminal (e.g., thereby decreasing the transistor's threshold voltage VT), and may be decreased by more negatively biasing its bulk terminal (e.g., thereby increasing VT). Conversely, the speed (e.g., and thus the relative strength) of a PMOS transistor may be increased by more negatively biasing its bulk terminal, and may be decreased by more positively biasing its bulk terminal. Thus, in accordance with the present invention, the behavior of memory cells 100 that fail to operate properly due to process variations inherent in the fabrication of semiconductor devices may be altered by selectively adjusting a bias voltage provided to the memory cells so that the collective set of memory cells will operate properly. In this manner, embodiments of the present invention may compensate for process variations inherent in the fabrication of semiconductor devices to increase the yield of configurable devices such as FPGA devices to correct improper operation of its configuration memory cells without relying upon costly memory redundancy techniques and without limiting the potential market for such devices.

Figure 4:
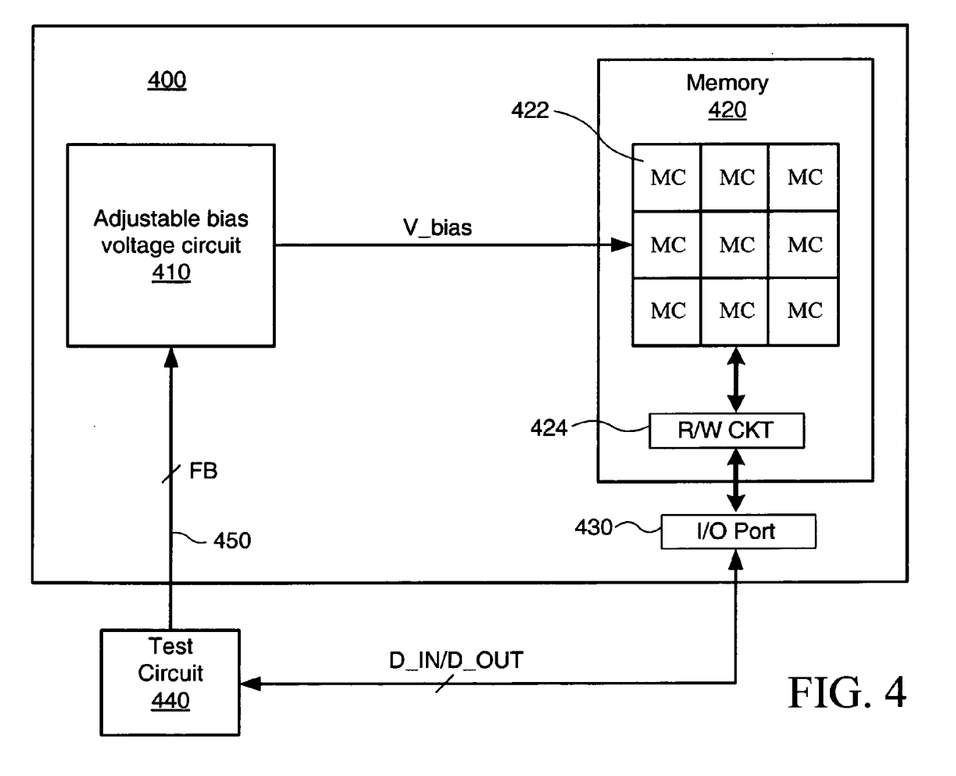
FIG. 4 is a block diagram of a device having an adjustable bias voltage circuit configured to selectively adjust the bias voltage for one or more memory cells in accordance with an exemplary embodiment of the present invention.

FIG. 4 shows an exemplary semiconductor device 400 within which various embodiments of the present invention may be implemented. Device 400, which is shown to include an adjustable bias voltage (ABV) circuit 410, a memory 420, and an I/O port 430, is coupled to a test circuit 440 via one or more I/O pins of the device (I/O pins not shown for simplicity). For purposes of discussion herein, device 400 is a PLD such as an FPGA, and memory 420 is a configuration memory that stores configuration information for various resources of the PLD. However, for other embodiments, memory 420 may be a general-purpose memory, and device 400 may be any suitable semiconductor device including, for example, an ASIC device. For some embodiments, test circuit 440 is external (e.g., off-chip) to device 400, as depicted in FIG. 4. However, for other embodiments, test circuit 440 may be implemented on-chip or within device 400.

Memory 420, which may be implemented using any well-known memory architecture, includes an array of configuration memory cells 422 and a read/write circuit 424. For simplicity, memory 420 is shown in FIG. 4 as including only nine memory cells 422. However, for actual embodiments, memory 420 may include any number of memory cells 422. Memory cells 422 may be any suitable type of memory cell including, for example, an EEPROM cell, EPROM cell, SRAM cell, or DRAM cell. Read/write circuit 424, which may include well-known write drivers and sense amplifiers, facilitates read and write operations for memory cells 422 in a well-known manner. Other well-known elements of memory 420, such as address decoders, clock signals, read/write enable signals, and the like, are not shown for simplicity.

I/O port 430 is well-known, and may be configured to facilitate communication between memory 420 and test circuit 440 in any suitable manner. For one embodiment, I/O port 430 may be configured to provide data to and from memory 420 in a serial format. For another embodiment, I/O port 430 may be configured to provide data to and from memory 420 in a parallel format. For yet another embodiment, I/O port 430 may be a well-known JTAG port that communicates with memory 420 using well-known JTAG commands and associated JTAG circuitry (JTAG circuitry not shown for simplicity).

Figure 5:
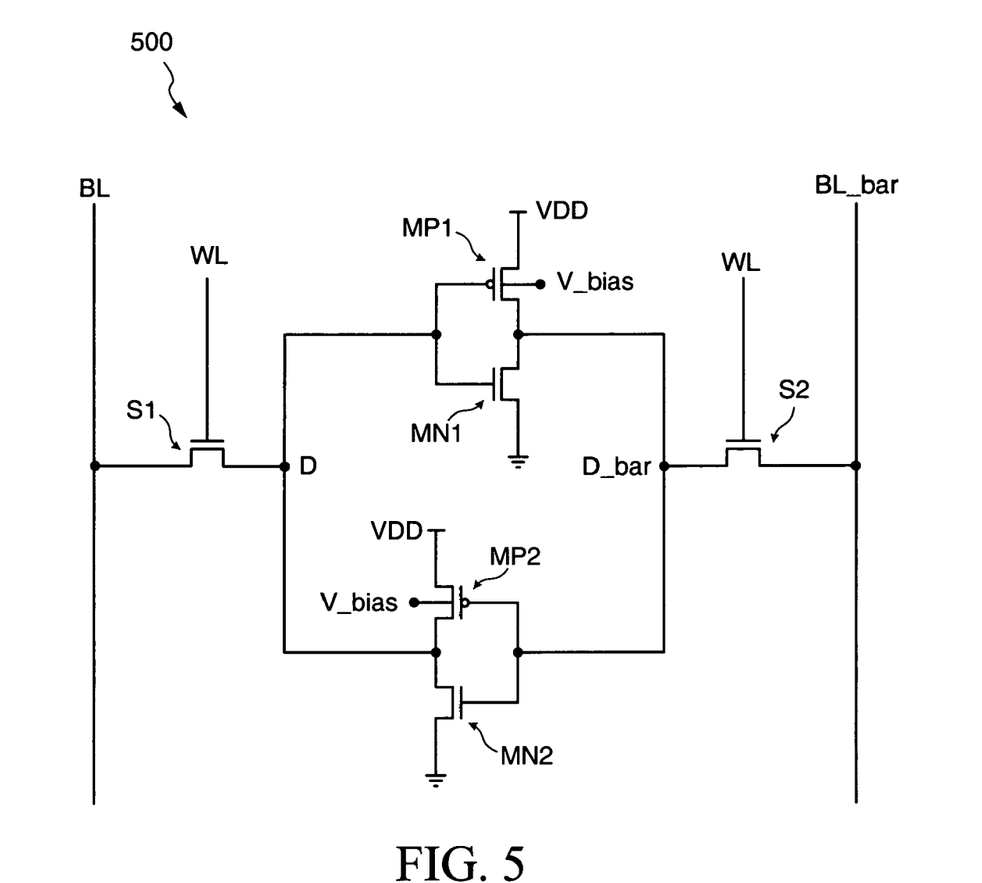
FIG. 5 is a circuit diagram of an SRAM cell configured in accordance with some embodiments of the present invention.

For purposes of discussion herein, memory cells 422 are SRAM cells configured as shown in FIG. 5. SRAM cell 500 of FIG. 5 is similar to SRAM cell 100 of FIG. 1, except that the bulk terminals of the PMOS transistors MP1-MP2 are coupled to a bias voltage V_bias that, as explained in more detail below, may be selectively adjusted by ABV circuit 410 to compensate for process variations inherent in the fabrication of device 400 that may cause one or more of configuration memory cells 422 to operate improperly. Although not shown in FIG. 5 for simplicity, for purposes of discussion herein, the bulk and source terminals of each NMOS transistor MN1-MN2 may be coupled together, and the bulk terminals of NMOS select transistors S1-S2 may be coupled to ground potential. However, for other embodiments, the bulk terminals of the NMOS transistors may be configured to receive a separate bias voltage generated by ABV circuit 410, for example, so that the operating characteristics of the NMOS transistors may be selectively altered to compensate for process variations inherent in the fabrication of device 400. NMOS bulk terminals require a triple well process—since all of the chips NMOS transistors are in the same substrate in a conventional process.

Figure 6:
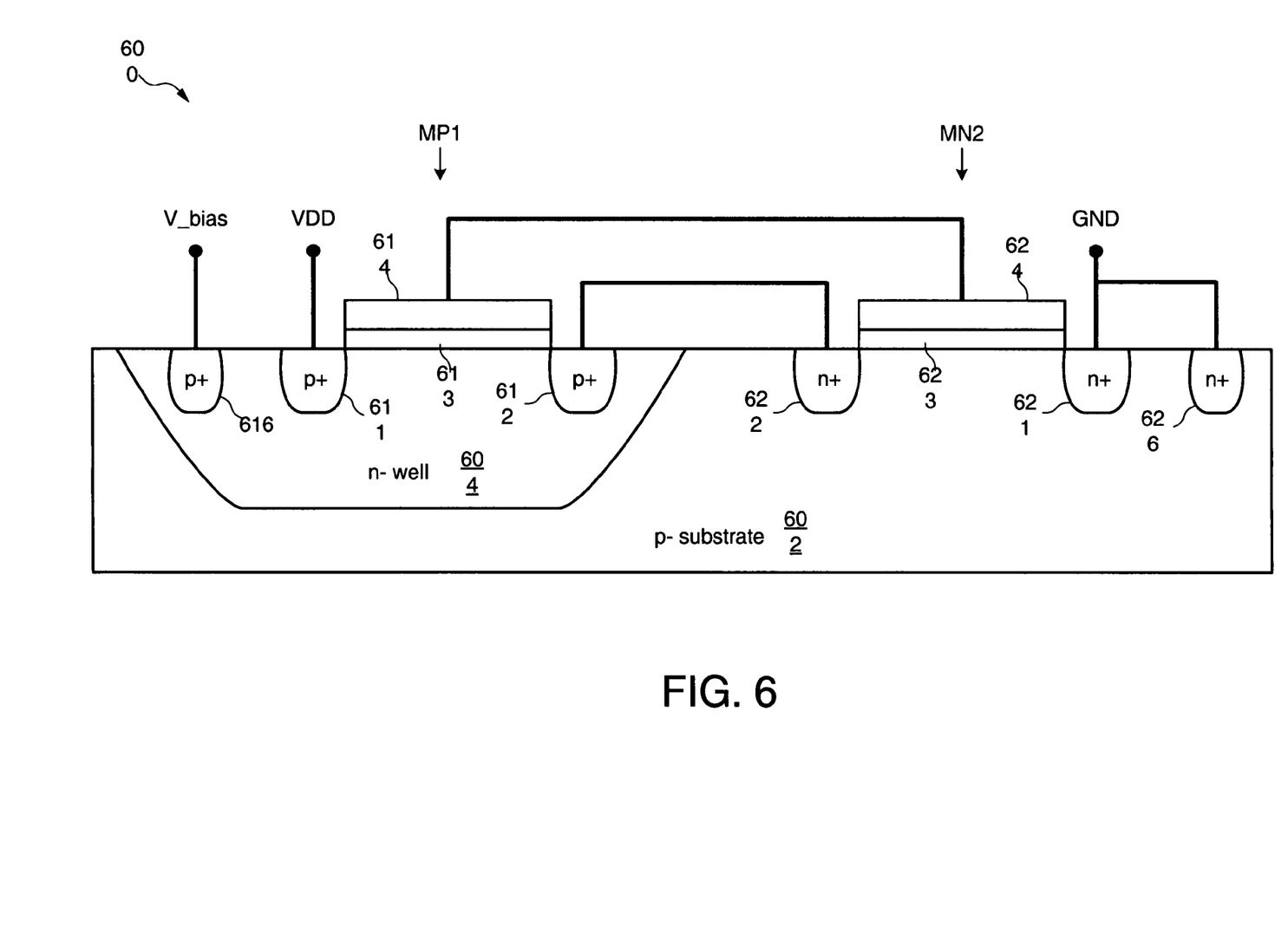
FIG. 6 is an illustrative cross-sectional diagram of an inverter of the SRAM cell of FIG. 5.

For the exemplary embodiments described herein, the memory cells 500 of memory 420 may be formed using a well-known process technology in which the NMOS transistors of memory cell 500 are formed in a p-type substrate and the PMOS transistors of memory cell 500 are formed in an n-type well region formed within the p-type substrate. For example, FIG. 6 is an illustrative cross-sectional view of a CMOS inverter that may be used to form memory cell 500 of FIG. 5. CMOS inverter 600, which is formed by the series connection of transistors MP1 and MN1 between VDD and ground potential (GND), is implemented in a p-type substrate 602 having an n-type well region 604 formed therein. PMOS transistor MP1 includes a p+ source region 611 and a p+ drain 612 formed in n− well region 604, and includes a gate 614 insulated from well region 604 by a layer of gate oxide 613. NMOS transistor MN1 includes an n+ source region 621 and an n+ drain 622 formed in p− substrate 602, and includes a gate 624 insulated from substrate 602 by a layer of gate oxide 623. The source 611 of transistor MP1 is coupled to VDD, the respective gates 614 and 624 of transistors MP1 and MN1 are commonly coupled, the respective drains 612 and 622 of transistors MP1 and MN1 are commonly coupled, and the source 621 of transistor MN1 is coupled to GND. The bulk terminal 616 of PMOS transistor MP1 is coupled to receive the bias voltage V_bias generated by ABV circuit 410, and the bulk terminal 626 of NMOS transistor MN1 is coupled to ground potential.

For some embodiments, p− substrate 602 may include a plurality of n-well regions 604, for example, wherein the PMOS transistors of all memory cells 500 in each row or column of memory 420 are formed in a separate n-well region. These n-wells may be tied together or may be separate. In this manner, embodiments of the present invention may be used to independently bias the memory cells in different rows and/or columns of memory 420.

Referring again to FIG. 4, test circuit 440 includes a test port coupled to read/write circuit 424 of memory 420 via device I/O port 430, and includes an output port coupled to ABV circuit 410 via one or more feedback signal lines 450. Test circuit 440 generates and/or provides one or more sets of input data D_IN for writing to memory 420, and is configured to compare resultant sets of output data D_OUT read from memory 420 with corresponding sets of D_IN to generate a feedback signal FB that indicates whether one or more of memory cells 422 fail to operate properly. For some embodiments, test circuit 440 asserts FB (e.g., to logic high) if one or more memory cells 422 do not operate properly, and de-asserts FB (e.g., to logic low) if all of memory cells 422 operate properly.

For the exemplary embodiments described herein, the feedback signal FB is depicted as a single signal. However, for actual embodiments, the feedback signal FB may be a plurality of signals. Further, although not shown in FIG. 4 for simplicity, for some embodiments, test circuit 440 may also provide various control signals to memory 420 via I/O port 430 to facilitate read and/or write operations for memory 420.

ABV circuit 410 includes an input to receive the feedback signal generated by test circuit 440, and includes an output coupled to the bulk terminals of the PMOS transistors that form the memory 500 cells of memory 420. In response to the feedback signal FB, ABV circuit 410 selectively adjusts a bias voltage V_bias provided to the n-well region(s) of memory 420 within which the PMOS transistors of its memory cells 500 are formed to alter the operating characteristics of memory cells 500 so that device 400 falls within the acceptable range of process margin. The bias voltage V_bias may be any suitable positive and/or negative voltage that sufficiently alters the operating characteristics of the memory cells' PMOS transistors so that all of the memory cells of memory 420 will operate properly. Although not shown in FIG. 4 for simplicity, for some embodiments, ABV circuit 410 includes a set of non-volatile memory elements that stores one or more bias control signals indicative of a desired bias voltage to be provided to memory 420. For one embodiment, ABV circuit 410 includes a plurality of fuses that may be selectively blown to store suitable values of the bias control signals that causes ABV circuit 410 to provide the desired bias voltage to memory 420.

Figure 7:
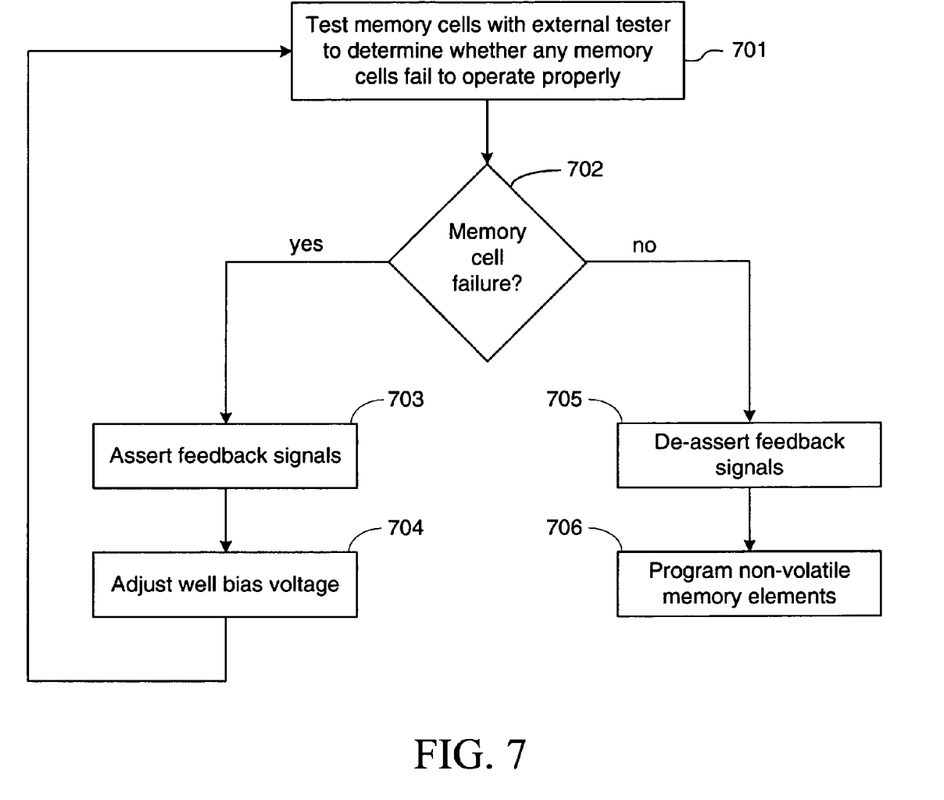
FIG. 7 is a flow chart illustrating an exemplary well biasing operation for some embodiments of the present invention.

An exemplary operation for altering the operating characteristics of memory 420 of device 400 is described below with respect to the illustrative flow chart of FIG. 7. For some embodiments, the operation described below with respect to FIG. 7 may be performed by the manufacturer of device 400 prior to delivery of device 400 to customers so that the biasing operation of ABV circuit 410 is transparent to the customers. However, for other embodiments, the operation described below with respect to FIG. 7 may be performed by the customer after delivery of device 400.

First, memory 420 is tested to determine whether any of its memory cells fail to operate properly (step 701). More specifically, test circuit 440 generates one or more sets of input data D_IN that are written to memory 420 via read/write circuit 424 in a well-known manner. The resultant data stored in memory 420 is read out as D_OUT via read/write circuit 424 in a well-known manner. Then, for each set of input data, test circuit 440 compares D_IN with D_OUT to determine whether all of the memory cells of memory 420 operate properly. For some embodiments, test circuit 440 may utilize the testing techniques described in U.S. Pat. No. 6,664,808, which is incorporated herein by reference. For other embodiments, other well-known memory test methodologies may be used.

If D_OUT does not match D_IN, as tested at step 702, test circuit 440 asserts FB to indicate that one or more of the memory cells of memory 420 do not operate properly (step 703). In response thereto, ABV circuit 410 adjusts the magnitude of the bias voltage provided to memory 420 (step 704), thereby altering the operating characteristics of its memory cells 422/500, for example, so that all of its memory cells will operate properly. Thereafter, test circuit 440 applies one or more additional sets of input data to memory 420 to determine whether any of its memory cells fail to operate properly (steps 701-702).

Conversely, if D_OUT matches D_IN, as tested at step 702, test circuit 440 de-asserts FB to indicate that all the memory cells of memory 420 operate properly (step 705). In response thereto, ABV circuit 410 programs its non-volatile memory element with one or more bias control signals representative of the currently selected bias voltage (step 705).

After the non-volatile memory elements within ABV circuit 410 have been programmed with the appropriate bias control signals that select a suitable bias voltage that compensates for process variations inherent in the fabrication of device 400 so that all of the configuration memory cells of memory 420 operate properly, device 400 may be shipped to customers. Thereafter, upon subsequent power-up of device 400 by a customer, ABV circuit 410 provides a desired bias voltage indicated by the control signals to memory 420 to alter the operating characteristics of its memory cells so that all of its memory cells operate properly. In this manner, embodiments of the present invention not only increase yield by "saving" devices 400 that would otherwise be discarded for memory cell failure due to process variations, but also operate transparently to the customer.

The exemplary embodiment of ABV circuit 410 described above is configured to selectively adjust the bias voltage for the PMOS transistors that form the memory cells of memory 420. Because the proper operation of memory cells 422/500 depends primarily upon the relative strengths of its PMOS and NMOS transistors, as discussed above with respect to FIGS. 3A-3D, selectively biasing only the n-type well region(s) that houses the PMOS transistors of memory cells 500 may alter the relative strengths of their PMOS and NMOS transistors (e.g., so that all of the memory cells operate properly) using minimal circuitry. For other embodiments, ABV circuit 410 may be configured to selectively bias only the NMOS transistors of memory cells 500. For still other embodiments, ABV circuit 410 may be configured to separately bias the PMOS and NMOS transistors of the memory cells, although configuring ABV circuit 410 to separately bias the PMOS and NMOS transistors of the memory cells requires more circuitry than configuring ABV circuit 410 to selectively bias only the PMOS transistors or only the NMOS transistors of the memory cells.

Figure 8:
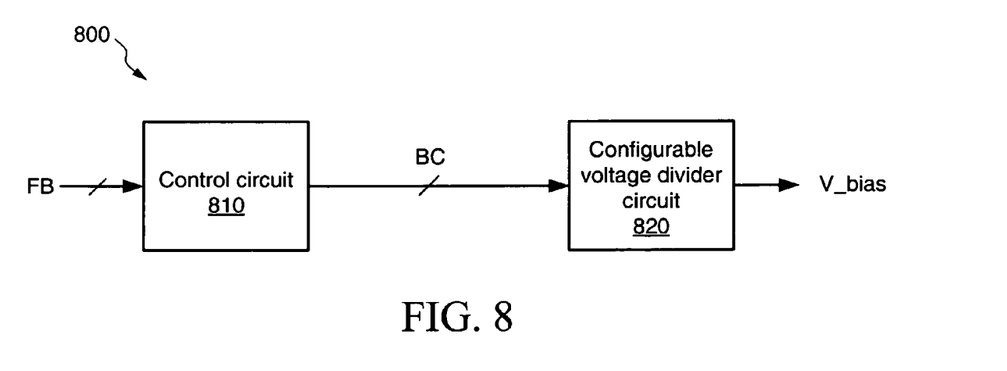
FIG. 8 is a block diagram of one embodiment of the adjustable bias voltage circuit of FIG. 4.

FIG. 8 shows an ABV circuit 800 that is one embodiment of ABV circuit 410 of FIG. 4. For exemplary purposes of discussion herein, ABV circuit 800, which includes a control circuit 810 and a configurable voltage-divider (CVD) circuit 820, is configured to selectively adjust a bias voltage provided to the n− well region(s) 604 within which corresponding PMOS transistors that implement memory cells 500 of memory 420 are formed. Of course, for other embodiments, ABV circuit 800 also may be configured to selectively adjust a bias voltage V_bias provided to the p− substrate 602 within which corresponding NMOS transistors that implement memory cells 500 of memory 420 are formed. Control circuit 810 includes an input to receive the feedback signal FB from test circuit 440, and includes an output to generate one more bias control signals BC. For some embodiments, the BC signal may represent a counter value. CVD circuit 820 includes inputs to receive the BC signal(s), and includes an output to generate V_bias.

As described above, test circuit 440 tests memory 420 to determine whether one or more of its configuration memory cells fail to operate properly, and in response thereto selectively asserts FB. If FB is asserted, control circuit 810 increments the counter value represented by the BC signals, which causes CVD circuit 820 to incrementally adjust the magnitude of V_bias. If FB is de-asserted, control circuit 810 preserves (e.g., stores) the current state of the BC signals, which causes CVD circuit 820 to maintain the current magnitude of V_bias. For some embodiments, the de-asserted state of FB also causes control circuit 810 to store the current values of the BC signals in its non-volatile memory elements (not shown in FIG. 8 for simplicity) so that upon a subsequent power-on of device 400, ABV circuit 800 provides the appropriate value of V_bias to memory 420.

Figure 9:
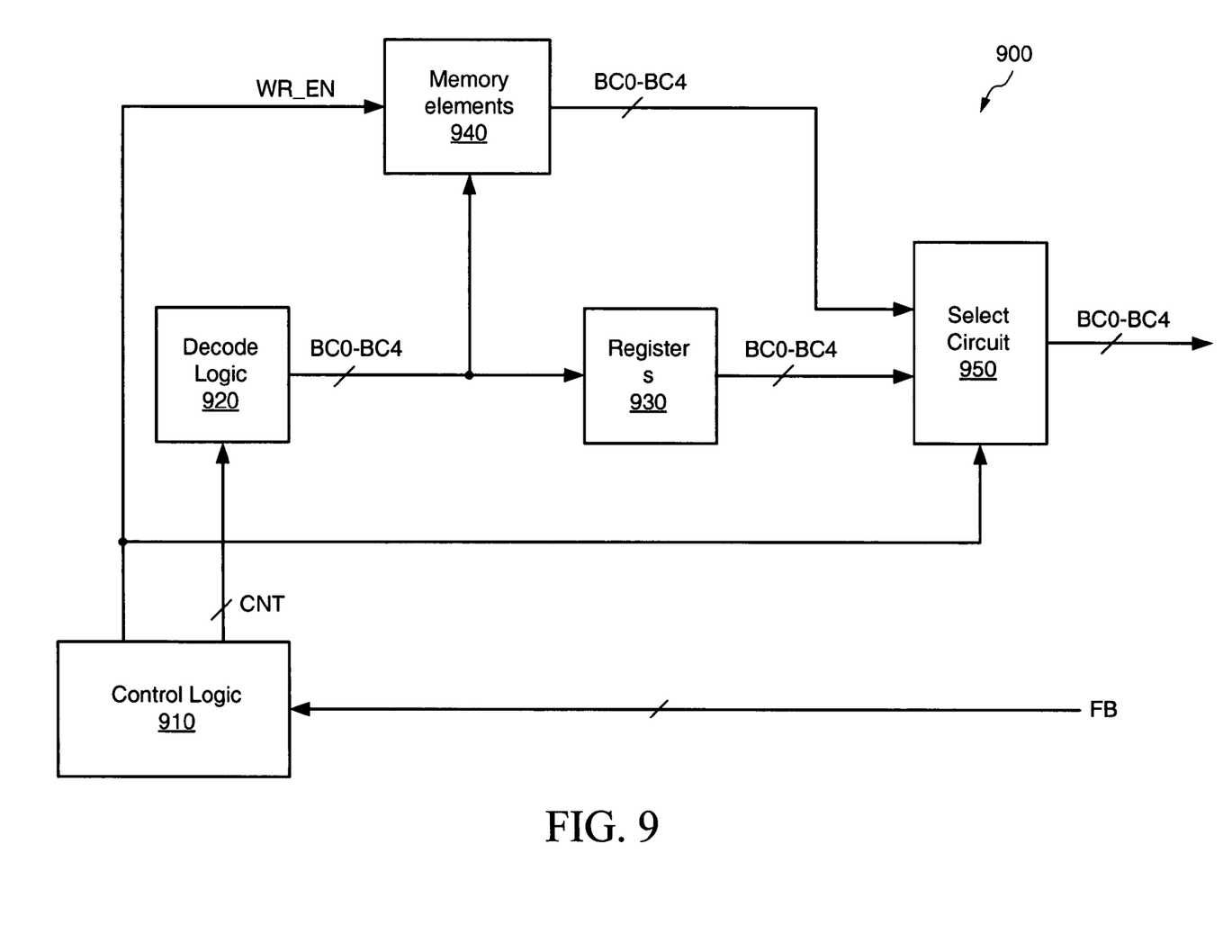
FIG. 9 is a block diagram of one embodiment of the control circuit of FIG. 8.

FIG. 9 shows a control circuit 900 that is one embodiment of control circuit 810 of FIG. 8. Control circuit 900 includes control logic 910, decode logic 920, registers 930, non-volatile memory elements 940, and a select circuit 950. Control logic 910 includes an input to receive FB, a first output to generate a counter value CNT, and a second output to generate a write enable signal WR_EN. For some embodiments, control logic 910 may include a counter that increments CNT in response to assertions of FB generated during corresponding testing operations of memory 420 performed by test circuit 440. Decode logic 920 includes an input to receive CNT, and includes outputs to generate bias control signals BC0-BC4. Registers 930, which may include any suitable registers or latch circuits, store the current values of BC0-BC4. Memory elements 940 may include any suitable non-volatile memory cells and/or circuitry for permanently storing the values of the BC0-BC4 signals. Memory elements 940 also includes a control input to receive WR_EN. Select circuit 950, which may be any suitable multiplexing circuit, includes first inputs to receive BC0-BC4 from registers 930, second inputs to receive BC0-BC4 from memory elements 940, outputs coupled to corresponding selectable voltage taps within CVD circuit 820, and a select terminal to receive WR_EN.

Figure 10A:
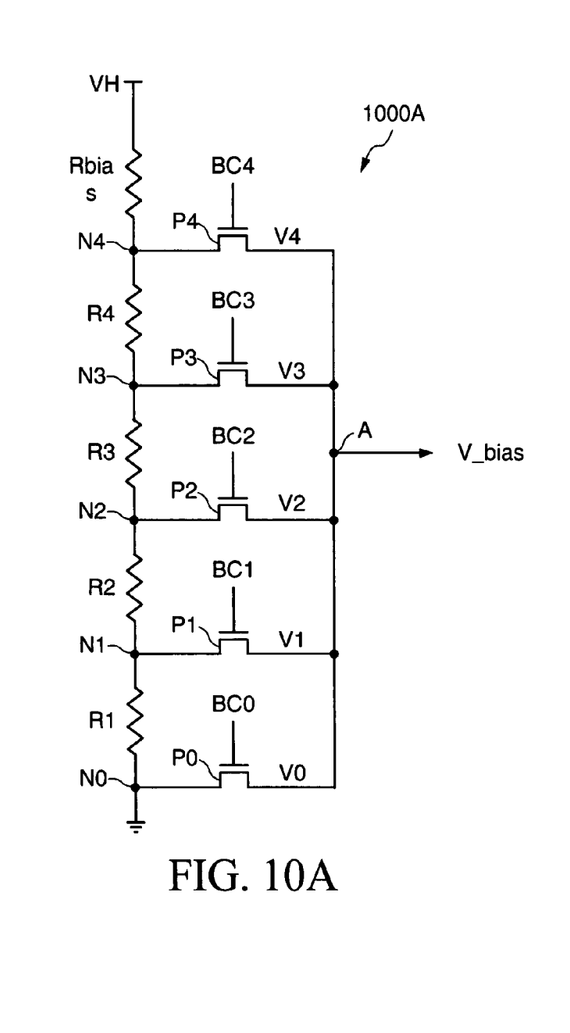
FIG. 10A is a circuit diagram of one embodiment of the configurable voltage-divider circuit of FIG. 8 for biasing the PMOS devices of the memory cells of FIG. 5.

FIG. 10A shows a CVD circuit 1000A that is one embodiment of CVD circuit 820 of FIG. 8 that may be used with control circuit 900 of FIG. 9. CVD circuit 1000A includes four resistors R1-R4 and a bias resistor Rbias connected in series between ground potential and a high voltage rail VH, and produces various voltages V0-V4 at a plurality of voltage nodes or taps N0-N4, respectively. Resistors R1-R4 may be any suitable resistance values that generate desired voltages V1-V4 at voltage taps N1-N4, respectively. For some embodiments, bias resistor Rbias is much larger (e.g., by one or two orders of magnitude) than resistors R1-R4 so that the voltages at taps N1-N4 provide relatively low bias voltages to memory 420. The voltage at rail VH, which may be generated using well-known circuit techniques, may be any suitable voltage level. For some embodiments, VH is greater than VDD. Five NMOS pass transistors P0-P4 are coupled in parallel between an output node A and corresponding voltage taps N0-N4, with each pass transistor P0-P4 having a gate to receive a corresponding bias control signal BC0-BC4.

Note that for the exemplary embodiments described herein, control circuit 900 is shown to generate five bias control signals BC0-BC4 that select corresponding voltages V0-V4 via pass transistors P0-P4, respectively, to be provided from CVD circuit 1000A as a bias voltage to memory 420. However, for actual embodiments, CVD circuit 1000A may include a greater number of voltage taps selectable by corresponding pass transistors to allow for greater control over the bias voltage provided to memory 420, and control circuit 900 may be configured to generate a corresponding number of BC signals for controlling the pass transistors of CVD circuit 1000A. Of course, for other embodiments, CVD circuit 1000A may include fewer than five voltage taps.

An exemplary operation of control circuit 900 and CVD circuit 1000A is as follows. After device 400 is fabricated, device 400 may be readied for test operations by initializing CNT to zero and de-asserting WR_EN to logic zero. The de-asserted state of WR_EN precludes write operations to memory elements 940, and causes select circuit 950 to forward the BC signals from registers 930 to CVD circuit 1000A. The zero value of CNT causes decode logic 920 to assert (e.g., to logic high) BC0 and to de-assert (e.g., to logic low) BC1-BC4. The asserted state of BC0 turns on pass transistor P0 and the de-asserted states of BC1-BC4 turn off corresponding pass transistors P1-P4, thereby causing CVD circuit 1000A to pull V_bias to ground potential.

Then, test circuit 440 tests memory 420 in the manner described above to determine whether any of its memory cells fail to operate properly. If one or more of its configuration memory cells do not operate properly, test circuit 440 asserts FB to logic high, which causes control logic 910 to increment CNT. In response thereto, decode logic 920 de-asserts BC0 and asserts BC1, which causes pass transistor P1 to provide the voltage V1 at node N1 as V_bias to memory 420. Increasing the well bias voltage (e.g., towards VH) provided to memory 420 increases the threshold voltage VT of its PMOS transistors, thereby causing the PMOS transistors to operate more slowly.

Thereafter, test circuit 440 again tests memory 420 to determine whether any of its memory cells fail to operate properly. If one or more memory cells still fail to operate properly, test circuit 440 again asserts FB to logic high, which causes control logic 910 to increment the value of CNT again. In response thereto, decode logic 920 de-asserts BC1 and asserts BC2, which causes pass transistor P2 to provide V2 as V_bias to memory 420, thereby further increasing V_bias to cause the PMOS transistors of memory cells 500 to operate even more slowly.

This process is repeated until control circuit 900 causes CVD circuit 1000A to generate a value of V_bias that results in all memory cells of memory 420 operating properly. Thus, when test circuit 440 determines that all memory cells of memory 420 operate properly, test circuit 440 de-asserts FB, which causes control logic 910 to assert WR_EN (e.g., to logic high) and to maintain the present value of CNT. The asserted state of WR_EN causes non-volatile memory elements 940 to store the current values of BC0-BC4, and causes select circuit 950 to provide the BC signals from non-volatile memory elements 940 to CVD circuit 1000A. In this manner, control circuit 900 may permanently store appropriate values for the BC0-BC4 signals that results in CVD circuit 1000A providing a desired bias voltage to memory 420 that causes all of its memory cells to operate properly.

As mentioned above, for some embodiments, memory elements 940 may include a plurality of fuses such as well-known e-fuses, which in turn may be blown by the manufacturer prior to delivery of device 400 to customers to store values for the bias control signals that cause all the memory cells of memory 420 to operate properly. In this manner, operations of the present embodiments that alter the operating characteristics of memory 420 (e.g., so that its memory cells operate properly) may be transparent to end users of device 400, thereby allowing the device manufacturer and/or supplier to increase yield of PLDs without requiring any action by the end users.

Further, although described above as initially providing a zero voltage via node N0 as the bias voltage to memory 420 of device 400 and then incrementally increasing the bias voltage towards VH in response to iterative assertions of FB during subsequent test operations of memory 420, for other embodiments, control circuit 900 may be configured to initially provide some intermediate voltage (e.g., via taps N1, N2, or N3) as the bias voltage to memory 420, and thereafter to selectively adjust the bias voltage in response to subsequent test operations of memory 420 via test circuit 440.

Figure 10B:
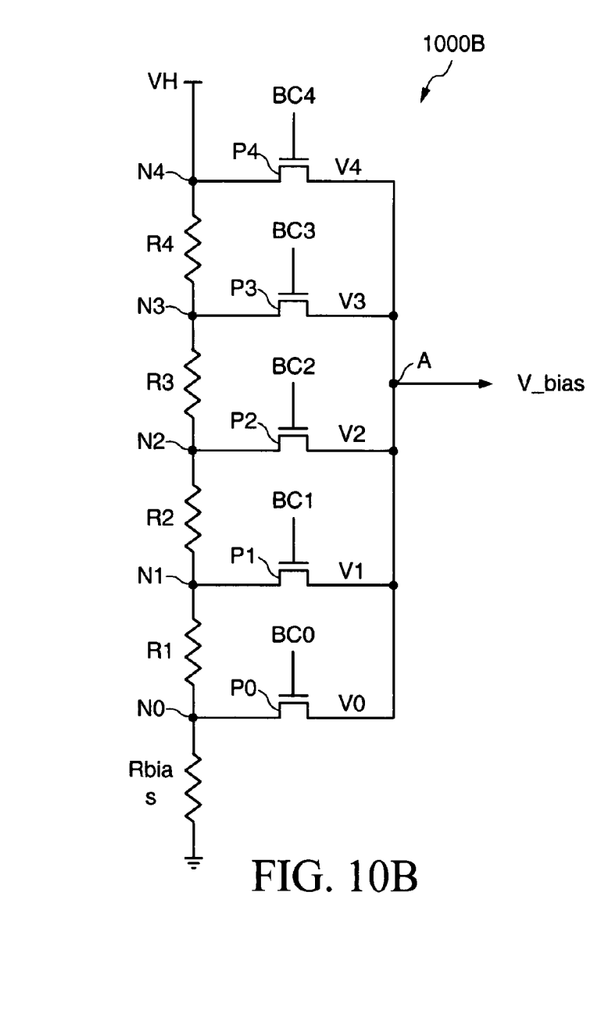
FIG. 10B is a circuit diagram of another embodiment of the configurable voltage-divider circuit of FIG. 8 for biasing the PMOS devices of the memory cells of FIG. 5.

FIG. 10B shows a CVD circuit 1000B that is another embodiment of CVD circuit 820 of FIG. 8 that may be used with control circuit 900 of FIG. 9. CVD circuit 1000B is similar to CVD circuit 1000A of FIG. 10A, except that the bias resistor Rbias is connected between voltage tap N0 and ground potential. In this manner, CVD circuit 1000B provides relatively high bias voltages to memory 420.

Figure 11A:
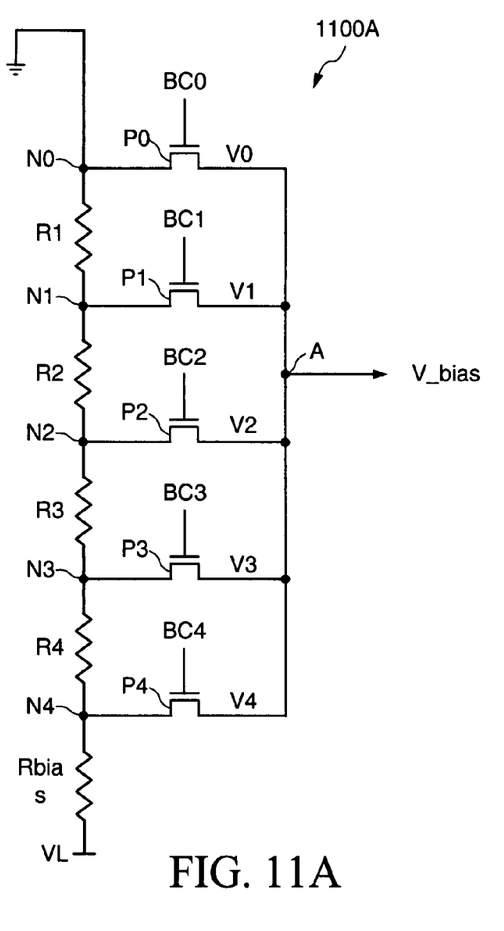
FIG. 11A is a circuit diagram of one embodiment of the configurable voltage-divider circuit of FIG. 8 for biasing the NMOS devices of the memory cells of FIG. 5.

As mentioned above, other embodiments of the present invention may be configured to selectively adjust a bias voltage provided to the p-type substrate within which the NMOS transistors that implement memory cells 500 are formed to alter the operating characteristics of the NMOS transistors to compensate for process variations inherent in the fabrication of device 400. For example, FIG. 11A shows a CVD circuit 1100A that may be used with control circuit 900 of FIG. 9 to provide an adjustable bias voltage V_bias to p– substrate 602 of memory 420. CVD circuit 1100A, which includes four resistors R1-R4 and a bias resistor Rbias connected in series between ground potential and a negative voltage rail VL, selectively provides negative voltages V0-V4 at corresponding taps N0-N4 to output node A via pass transistors P0-P4, respectively. Resistors R1-R4 may be any suitable resistance values that generate desired voltages V1-V4 at voltage taps N1-N4, respectively. For some embodiments, bias resistor Rbias is much larger (e.g., by one or two orders of magnitude) than resistors R1-R4 so that the voltages at taps N1-N4 provide relatively low negative bias voltages to memory 420. The voltage at rail VL, which may be generated using well-known circuit techniques, may be any suitable negative voltage level.

Operation of CVD circuit 1100A may be controlled by control circuit 900 in a manner similar to that described above with respect to CVD circuit 1000A of FIG. 10A, wherein incrementing CNT causes CVD circuit 1100A to provide increasingly negative bias voltages to memory 420 to incrementally decrease the speed of the NMOS transistors that form the memory cells of memory 420.

Figure 11B:
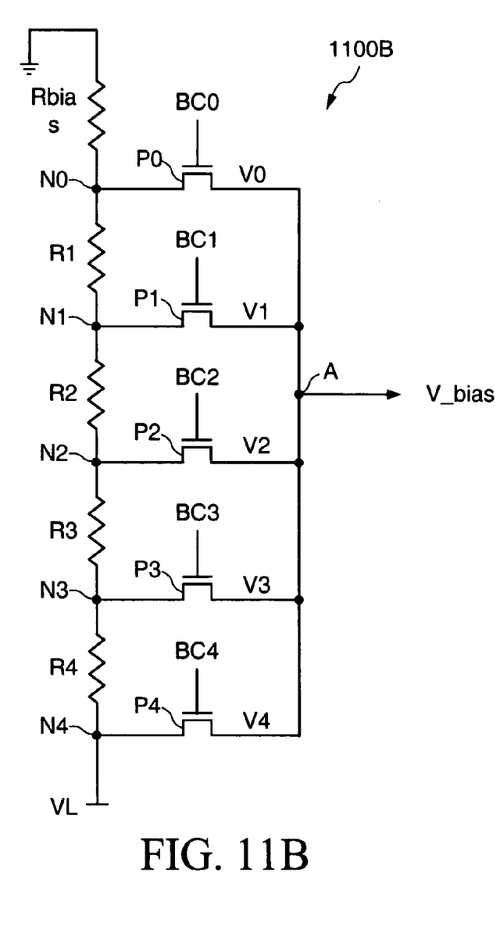
FIG. 11B is a circuit diagram of another embodiment of the configurable voltage-divider circuit of FIG. 8 for biasing the NMOS devices of the memory cells of FIG. 5.

FIG. 11B shows a CVD circuit 1100B that is another embodiment of CVD circuit 820 of FIG. 8 that may be used with control circuit 900 of FIG. 9. CVD circuit 1100B is similar to CVD circuit 1100A of FIG. 11A, except that the bias resistor Rbias is connected between voltage tap N0 and ground potential. In this manner, CVD circuit 1100B provides relatively high negative bias voltages to memory 420.

For still other embodiments, CVD circuits 1000A and/or 1000B may be used to adjust the bias voltage of the NMOS transistors that form the memory cells 422/500 of memory 420, for example, to some positive voltage that is less than the source voltages of such transistors. In this manner, negative voltages (e.g., such those generated by CVD circuits 1100A and 1100B of FIGS. 11A and 11B, respectively) need not be generated, which may reduce circuit size.

Although some exemplary embodiments are described above with respect to CVD circuits 1000 and/or 1100, numerous other voltage divider circuits that selectively adjust bias voltages for memory 420 in response to feedback information generated by test circuit 440 may be used within ABV circuit 800, as will be apparent to those skilled in the art after reading this disclosure. For example, some embodiments of the CVD circuit may include circuitry that initially couples the bulk terminal of each PMOS and/or NMOS transistor of memory cell 500 to its corresponding source terminal, and thereafter selectively adjusts the bias voltage in response to the bias controls signals generated by control logic 810 in response to the feedback information provided by test circuit 440.

For other embodiments, test circuit 440 may be configured to determine (e.g., during testing of memory 420) whether the PMOS and NMOS transistors that form memory cells 500 are too fast or too slow, and to generate the feedback signal FB accordingly. For such embodiments, ABV circuit 800 may be configured to selectively adjust the bias voltages provided to n– well region(s) 604 and/or p– substrate 602 to compensate for process variations by altering the relative strengths of the PMOS and NMOS transistors to shift the process distribution of device 400 so that all of its configuration memory cells operate properly, as summarized below in Table 1.

TABLE 1

| Condition | Function |
| --- | --- |
| NMOS devices too fast | Decrease bias voltage |
| NMOS devices too slow | Increase bias voltage |
| PMOS devices too fast | Increase bias voltage |
| PMOS devices too slow | Decrease bias voltage |

Embodiments of the present invention may be useful during both the sampling and the production phases of device fabrication. For example, during the sampling phase in which a foundry provides samples of device 400, present embodiments may be used to test memory 420, and if all of its memory cells do not operate properly, to identify the cause of failure (e.g., the PMOS transistors are too slow). This information may be used by the foundry to alter its process technology (e.g., so that the PMOS transistors are stronger) to increase yield. Further, during the production phase, embodiments of the present invention may be used to selectively adjust the bias voltages for the PMOS and/or NMOS transistors to compensate for process variations to automatically ensure that all memory cells of memory 420 operate properly, irrespective of periodic shifts in operating characteristics.

Embodiments of the present invention are particularly applicable to PLDs such as FPGAs that require configuration memory cells to implement a specified user design. As mentioned above, because a PLD may not be able to implement a particular user design if one or more of its configuration memory cells fail to operate properly, and is thus typically discarded even if only one of its configuration memory cells fails to operate properly, the ability to alter the operating characteristics of a PLD's configuration memory cells to compensate for process variations so that all of the memory cells operate properly may significantly increase device yield, which is advantageous to the PLD manufacturer.

Further, as mentioned above, the p– substrate within which memory 420 of device 400 is formed may include a plurality of n-well regions. For example, for some embodiments, the PMOS transistors that form memory cells 500 in each row or column of memory 420 may be formed in separate n-well regions. For such embodiments, ABV circuit 800 may include a plurality of non-volatile memory element sets, each for storing a set of bias control signals for a corresponding n-well region. In this manner, embodiments of the present invention may be used to independently bias the various n-well regions of memory 420 so that the operating characteristics of memory cells in different rows or columns of memory 420 may be independently altered, thereby allowing for greater control over the operating characteristics of the device's memory cells. For example, if one or more memory cells in a first portion of the device contain "slow" transistors and one or more memory cells in a second portion of the device contain "fast" transistors, different memory cell bias voltages may be applied to the first and second portions so that the memory cells in both portions of the device will operate properly.

While particular embodiments of the present invention have been shown and described, it will be obvious to those skilled in the art that changes and modifications may be made without departing from this invention in its broader aspects, and therefore, the appended claims are to encompass within their scope all such changes and modifications as fall within the true spirit and scope of this invention.

What is claimed is:

1. A system that compensates for process variations in a semiconductor device, comprising:
   a memory array having a plurality of memory cells formed in one or more well regions of the device;
   a test circuit having a test port coupled to the memory array and having an output to generate a feedback signal indicating whether one or more of the memory cells fail to operate properly in response to a testing of the operation of the memory cells; and
   an adjustable bias voltage circuit having an input to receive the feedback signal and having an output coupled to the one or more well regions, wherein the adjustable bias voltage circuit is configured to selectively adjust a bias voltage provided to the one or more well regions in response to the feedback signal to alter the operating characteristics of the memory cells,
   wherein the adjustable bias voltage circuit comprises:
      a control circuit having an input to receive the feedback signal and having outputs to generate a plurality of bias control signals; and
      a configurable voltage-divider circuit having a plurality of voltage taps selectively coupled to the one or more well regions in response to corresponding bias control signals, and
   wherein the control circuit is configured to selectively assert the bias control signals in response to iterative assertions of the feedback signal generated during corresponding test operations of the memory array.

2. The system of claim 1, wherein the device comprises a programmable logic device, and the memory cells comprise configuration memory cells for storing configuration information for various programmable resources of the programmable logic device.

3. The system of claim 1, further comprising:
   a plurality of non-volatile memory elements for storing control signals that cause the adjustable bias voltage circuit to provide a desired bias voltage to the memory array so that one or more of the memory cells that originally failed to operate properly due to process variations will operate properly.

4. The system of claim 3, wherein the non-volatile memory elements comprise fuses that may be programmed to store the control signals before the device is delivered to a customer.

5. The system of claim 1, wherein the test circuit is configured to generate the feedback signal in response to a comparison of an input data set to be written to the memory array and a corresponding output data set read back from the memory array.

6. The system of claim 1, wherein the configurable voltage-divider circuit comprises:
   a plurality of resistors connected in series between a first voltage supply and a second voltage supply, wherein a first terminal of each resistor forms a corresponding voltage tap; and
   a plurality of pass transistors, each coupled between the first terminal of a corresponding resistor and the one or more well regions of the memory array and having a gate to receive a corresponding bias control signal.

7. A system that compensates for process variations in a semiconductor device, comprising:
   a memory array having a plurality of memory cells formed in one or more well regions of the device;
   a test circuit having a test port coupled to the memory array and having an output to generate a feedback signal indicating whether one or more of the memory cells fail to operate properly in response to a testing of the operation of the memory cells; and
   an adjustable bias voltage circuit having an input to receive the feedback signal and having an output coupled to the one or more well regions, wherein the adjustable bias voltage circuit is configured to selectively adjust a bias voltage provided to the one or more well regions in response to the feedback signal to alter the operating characteristics of the memory cells,
   wherein the adjustable bias voltage circuit comprises:
      a control circuit having an input to receive the feedback signal and having outputs to generate a plurality of bias control signals; and
      a configurable voltage-divider circuit having a plurality of voltage taps selectively coupled to the one or more well regions in response to corresponding bias control signals, and
   wherein the control circuit comprises:
      control logic having an input to receive the feedback signal, a first output to generate a counter value, and a second output to generate a write enable signal;

decode logic having an input to receive the counter value and having a plurality of outputs to selectively assert the bias control signals in response to the counter value; and a plurality of non-volatile memory elements, each configured to selectively store a corresponding bias control signal in response to the write enable signal.

8. The system of claim 7, wherein the control logic is configured to increment the counter value if the feedback signal is asserted and to assert the write enable signal if the feedback signal is de-asserted.

9. The system of claim 7, wherein the control circuit further comprises:

a plurality of registers, each for storing a corresponding bias control signal; and a select circuit having first inputs coupled to the non-volatile memory elements, second inputs coupled to the registers, outputs coupled to the configurable voltage-divider circuit, and a control terminal to receive a select signal.

10. The system of claim 9, wherein the write enable signal comprises the select signal.

11. A method of compensating for process variations inherent in the fabrication of a semiconductor device that may cause one or more memory cells of the device to operate improperly, the method comprising:

testing the memory cells to determine whether one or more of the memory cells fail to operate properly;

generating a feedback signal in response to the testing; and adjusting a bias voltage provided to the memory cells in response to the feedback signal wherein the testing comprises:

writing input data to the memory cells;

reading output data from the memory cells; and comparing the input data with the output data; and wherein the generating comprises:

asserting the feedback signal if the output data does not match the input data; and de-asserting the feedback signal if the output data matches the input data.

12. The method of claim 11, further comprising:

repeating the testing, generating, and adjusting steps until the feedback signal is de-asserted.

13. The method of claim 11, wherein the adjusting comprises:

incrementing the bias voltage towards a predetermined value if the feedback signal is asserted; and maintaining the bias voltage if the feedback signal is de-asserted.

14. The method of claim 13, further comprising:

programming one or more non-volatile memory elements within the device with one or more control signals indicative of a desired bias voltage in response to the de-assertion of the feedback signal.

15. The method of claim 14, wherein the non-volatile memory elements comprise fuses.

16. The method of claim 15, wherein the fuses are programmed before the device is delivered to a customer.

17. The system of claim 7, wherein the device comprises a programmable logic device, and the memory cells comprise configuration memory cells for storing configuration information for various programmable resources of the programmable logic device.

18. The system of claim 7, further comprising:

a plurality of non-volatile memory elements for storing control signals that cause the adjustable bias voltage circuit to provide a desired bias voltage to the memory array so that one or more of the memory cells that originally failed to operate properly due to process variations will operate properly.

19. The system of claim 7, wherein the test circuit is configured to generate the feedback signal in response to a comparison of an input data set to be written to the memory array and a corresponding output data set read back from the memory array.

20. The system of claim 7, wherein the configurable voltage-divider circuit comprises:

a plurality of resistors connected in series between a first voltage supply and a second voltage supply, wherein a first terminal of each resistor forms a corresponding voltage tap; and a plurality of pass transistors, each coupled between the first terminal of a corresponding resistor and the one or more well regions of the memory array and having a gate to receive a corresponding bias control signal.

* * * * *